United States Patent

Chang

(10) Patent No.: US 9,165,744 B2
(45) Date of Patent: Oct. 20, 2015

(54) APPARATUS FOR TREATING ION BEAM

(71) Applicant: Varian Semiconductor Equipment Associates, Inc., Gloucester, MA (US)

(72) Inventor: Shengwu Chang, South Hamilton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 13/658,990

(22) Filed: Oct. 24, 2012

(65) Prior Publication Data

US 2014/0110596 A1 Apr. 24, 2014

(51) Int. Cl.
H01J 37/12 (2006.01)
H01J 37/147 (2006.01)
H01J 37/317 (2006.01)

(52) U.S. Cl.
CPC .............. *H01J 37/12* (2013.01); *H01J 37/1474* (2013.01); *H01J 37/3171* (2013.01); *H01J 2237/121* (2013.01); *H01J 2237/151* (2013.01)

(58) Field of Classification Search
USPC ............... 250/396 R, 697, 398, 396 ML, 397
See application file for complete search history.

(56) References Cited

U.S. PATENT DOCUMENTS

| | | | |
|---|---|---|---|
| 5,028,795 A | 7/1991 | Sakurada et al. | |
| 2002/0033458 A1 | 3/2002 | Nagano et al. | |
| 2008/0067397 A1* | 3/2008 | Tsukihara et al. | ..... 250/396 ML |
| 2008/0258074 A1 | 10/2008 | Tsukihara et al. | |
| 2011/0095175 A1* | 4/2011 | Bateman | ....................... 250/282 |

FOREIGN PATENT DOCUMENTS

JP 2003-036808 A 2/2003

OTHER PUBLICATIONS

Database WPI, Week 198223, Thomson Scientific, London, GB, JP S57-69653A, Fujitsu Ltd., Abstract, Apr. 28, 1982.
International Search Report and Written Opinion mailed Jan. 31, 2014 for PCT/US2013/066160 filed Oct. 22, 2013.

\* cited by examiner

*Primary Examiner* — Nicole Ippolito
*Assistant Examiner* — Hanway Chang
(74) *Attorney, Agent, or Firm* — Kacvinsky Daisak Bluin PLLC (57) ABSTRACT

An ion beam scanning assembly includes a set of scanning electrodes defining a gap to accept an ion beam and scan the ion beam in a first plane, and a multipole electrostatic lens system comprising a plurality of electrodes arranged along a portion of a path of travel of the ion beam bounded by the pair of scanning electrodes, the multipole electrostatic lens system configured to shape the ion beam in a direction perpendicular to the first plane.

19 Claims, 12 Drawing Sheets

APPARATUS FOR TREATING ION BEAM

FIELD

This invention relates to an ion implantation apparatus, more particularly, to lens components of an ion implanter.

BACKGROUND

Present day manufacturing for semiconductor electronics, solar cells, and other technology relies on ion implanter systems for doping or otherwise modifying silicon and other types of substrates. A typical ion implanter system performs the doping by generating an ion beam and steering it into a substrate so that the ions come to rest beneath the surface. Different types of ion implantation systems have been developed for different applications. High-current ion implanter systems are one type of implanter system that is widely used in semiconductor manufacturing. Such implanter systems typically produce currents up to 25 milliamperes (mA) and may be employed to efficiently introduce high doses of implanted species into a substrate.

Medium-current ion implanter systems have been developed to produce an ion beam having an intensity in the range of one microampere to about five mA, at energies between 2 kilo electron volts (keV) and 900 keV. These types of ion implantation systems may be especially useful to introduce dopant into a substrate in concentration ranges of about 1E13 to 5E14 or so. Generally, medium current implanter systems have been developed to operate by scanning a spot beam across a wafer In particular, for many applications, during ion implantation, it is desirable to achieve a uniform ion dose or beam current profile along the scan path. One approach to achieve this is to scan a spot beam in one plane while moving a target wafer in a direction orthogonal the plane to treat an entire surface of the target wafer. Scanning of an ion beam may be accomplished by the use of electrostatic scanners that are employed to controllably deflect the ion beam from its normal trajectory to span a larger area by changing the electric fields in a direction perpendicular to the direction of travel of the ion beam. The strength of the scanner field determines the total deflection from the normal path of the ion beam, hence the ion beam may be scanned by changing the electric field strength of the scanner elements.

Figure 1A:
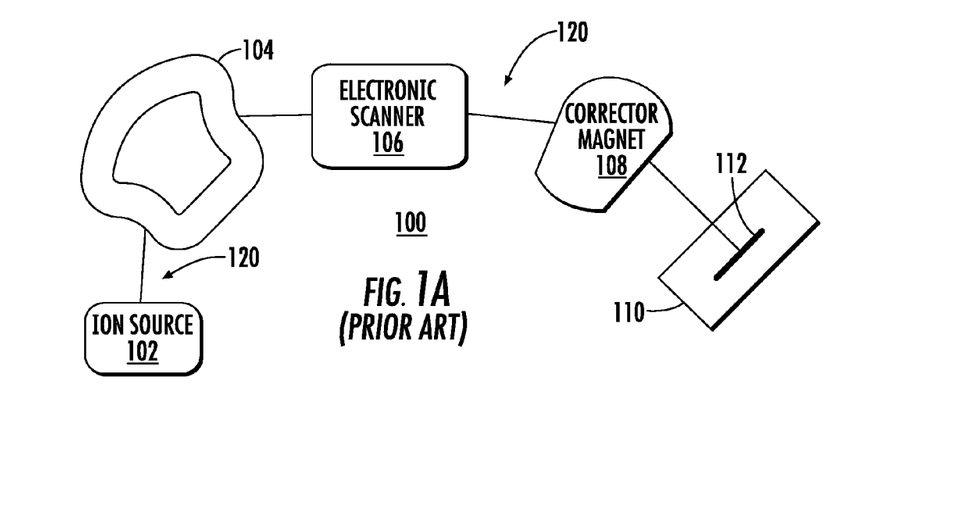
FIG. 1a depicts a known ion implantation system.

FIG. 1a depicts an ion implantation system 100 that is arranged according to the prior art. As illustrated, the ion implantation system 100 includes an ion source 102, which typically is used to generate positive ions for implantation. The positive ions are provided as an ion beam that is deflected, accelerated, decelerated, shaped, and/or scanned between its emergence from the ion source and a substrate to be processed. An ion beam 120 is illustrated in FIG. 1 by a central ray trajectory (CRT). However, it will be appreciated by those of skill in the art, that an ion beam has a finite width, height, and shape, which may vary along the beam path between the ion source 102 and substrate 112. FIG. 1a further depicts a mass analyzer 104 that deflects the ion beam, an electrostatic scanner 106, corrector magnet 108, and end station 110 that may manipulate the substrate 112. In known systems, the electrostatic scanner 106 generates an electric field that is generally perpendicular to the direction of travel of ion beam 120 as it passes through the electrostatic scanner 106.

Figure 1B:
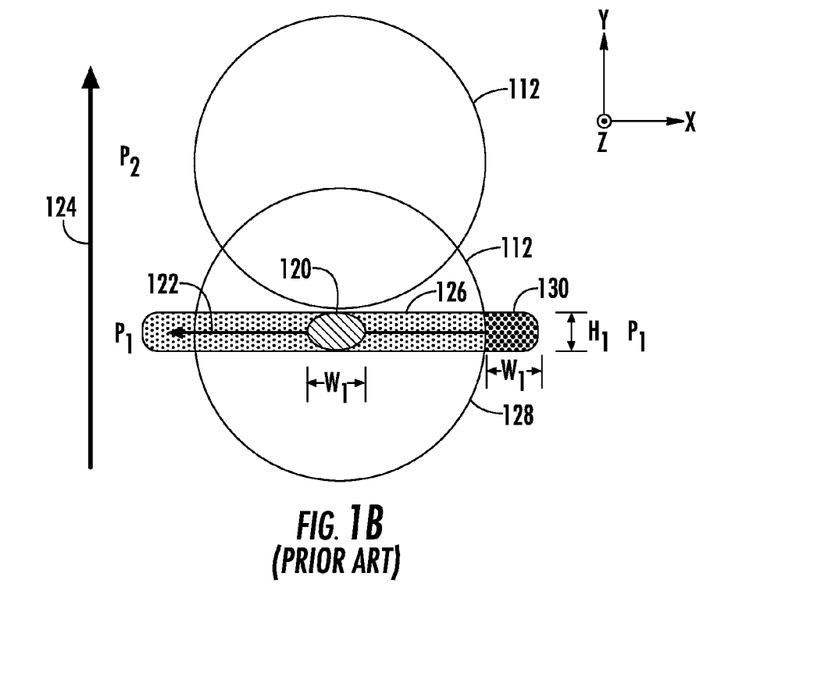
FIG. 1b depicts processing of a substrate using an ion beam according to the prior art.

FIG. 1b illustrates a known scenario in which a spot beam is used to implant a substrate. In the example shown, the substrate 112 is a circular wafer, such as a silicon wafer. FIG. 1b depicts a cross-section of the ion beam 120 projected onto the substrate 112. In known systems, it is typical for a scanner, such as the electrostatic scanner 106, to scan an ion beam along a direction, such as a direction 122 (shown as parallel to the X-axis of the Cartesian coordinate system illustrated), while the substrate 112 is independently translated along a second direction 124 (shown as parallel to the Y-axis), which may be perpendicular to the first direction. The action of translating the substrate along direction 124 together with the scanning of ion beam 120 along the direction 122 may allow the ion beam 120 to expose the entire substrate 112 to ions. In the example illustrated, the ion beam 120 is a spot beam having a height $H_1$ and width $W_1$.

As shown in FIG. 1b, when the ion beam 120 is scanned along the direction 122 the ion beam 120 covers a scanned area 126. Because of the size and shape of the ion beam 120 and shape of the substrate 112, in order to ensure that all desired regions of the substrate 112 are exposed to the ion beam 120, the ion beam 120 is typically scanned beyond the edge 128 of the substrate 112 as illustrated. For example, it may be necessary to scan the ion beam 120 past the edge 128 a distance comparable to or even larger than width $W_1$, as suggested in FIG. 1b. The scanned area 126 may thus include a substantial region 130 (shown only along one side of the substrate 112 for clarity) that lies outside of the substrate 112 and represents a dose of ions that is "wasted," that is, the ions in region 130 are not used to implant or otherwise treat the substrate 112.

In addition, if the height $H_1$ of the ion beam 120 is not sufficiently large, implantation dose non-uniformities may result. It may be desirable to ensure that the height $H_1$ is not so large that ions strike beamline components such as pole pieces of corrector magnets that may be arranged to surround the ion beam 120. However, if the value of $H_1$ is too small, the substrate 112 may be non-uniformly implanted when the substrate 112 is translated along the direction 124. For example, an ion beam 120 may oscillate in the direction 122 when the substrate is located at position P1, leading to implantation in an area on the substrate 112 that corresponds to the portion of the scanned area 126 that impinges on the substrate 112. The substrate 112 may then be stepped or scanned along the direction 124, leading to successive areas of comparable size to scanned area 126 being exposed on the substrate 112 due to the action of the electrostatic scanner 106. However, due to the finite dimension for the ion beam 120 along the direction 124, that is height $H_1$, there may be underlap or overlap of the successive areas exposed by the scanning of ion beam 120 along the direction 122.

In order to improve uniformity in such ion implantation systems, it may be desirable to alter the beam size and or shape of an ion beam in cross-section. For example, extra lens elements may be added to the beamline to alter the beam shape, such as a lens to increase the beam spot size. However, the introduction of extra lens elements serves to increase the ion beam path length and to change the footprint of an ion implantation system, both of which are generally not desirable. In addition, the introduction of electrostatic scanners in series with components such as lens elements to shape the ion beam may create an increased region in which electrons are stripped from the ion beam. As is known, whenever electron are stripped or removed from a (positive) ion beam, the ion beam has a tendency to expand. This takes place due to the mutual repulsion of positive ions within the ion beam. The ion beam may be stripped of electrons anytime low energy electrons are attracted and accelerated out of the ion beam by a high positive potential applied to any of various beamline components. A result of beam expansion may include a reduction in beam current that can effectively be applied to a substrate.

What is needed is an improved method and apparatus to form more uniform beams in ion implantation systems, such as medium current ion implantation systems.

SUMMARY

This Summary is provided to introduce a selection of concepts in a simplified form that are further described below in the Detailed Description, and is not intended to identify key features or essential features of the claimed subject matter, nor is it intended as an aid in determining the scope of the claimed subject matter.

In one embodiment, an ion beam scanning assembly includes a set of scanning electrodes defining a gap to accept an ion beam and scan the ion beam in a first plane. A multipole electrostatic lens system is also included which comprises a plurality of electrodes arranged along a portion of a path of travel of the ion beam bounded by the pair of scanning electrodes. The multipole electrostatic lens system is configured to shape the ion beam in a direction perpendicular to the first plane.

In a further embodiment, a method of treating an ion beam may include generating one or more oscillating electric fields along a first plane perpendicular to the ion beam over a portion of an ion beam path of the ion beam; and applying a set of static electric fields along the portion of the ion beam path in a direction perpendicular to the first plane.

BRIEF DESCRIPTION OF THE DRAWINGS

FIG. 4b depicts a back view of the ion beam scanning assembly in the scenario of FIG. 4a;

FIG. 5b depicts a back view of the ion beam scanning assembly in the scenario of FIG. 4a;

DETAILED DESCRIPTION

The embodiments described herein provide apparatus and methods for treating an ion beam in an ion implantation system. Examples of an ion implantation system include a beamline ion implantation system. The ion implantation systems covered by the present-embodiments include those that generate "spot ion beams" that have a cross-section that has the general shape of a spot. In the present embodiments, a beam shaper component (or system) is added to an electrostatic scanner component that contains a set of scanning electrodes to form an ion beam scanning assembly that treats an ion beam so that performance of the ion implantation apparatus is improved without requiring an additional footprint for the beam shaper component.

Figure 2:
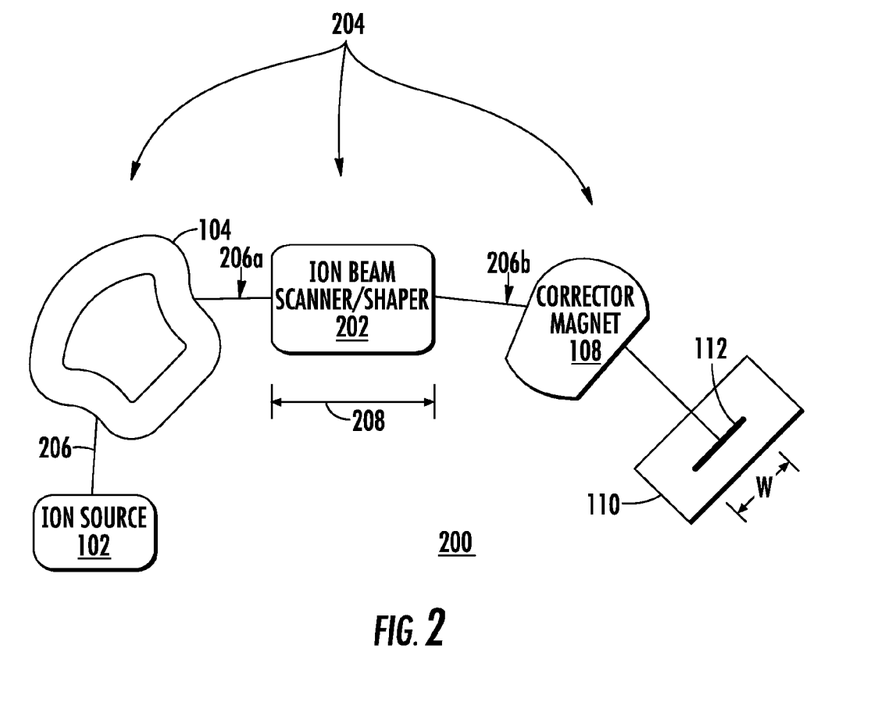
FIG. 2 depicts an ion implantation system according to an embodiment of the disclosure.

FIG. 2 depicts an ion implantation system 200 according to an embodiment of the disclosure. The ion implantation system 200 may include conventional components including the ion source 102, magnetic analyzer 104, corrector magnet 108 and substrate stage 110. In various embodiments the ion implantation system 100 generates a spot type ion beam that is scanned by an electrostatic scanner component to provide ion implantation over a substrate that is larger than the cross-sectional area of the spot type ion beam. In the example of FIG. 2, an ion beam electrostatic scanner/ion beam shaper, or simply an ion beam scanning assembly 202 is disposed along the beamline 204 at a point between the magnetic analyzer 104 and corrector magnet 108. The ion beam scanning assembly 202 is arranged to receive an ion beam 206 generated by the ion source 102 and to produce a scanned and shaped beam that may be further manipulated, such as by the corrector magnet 108 before impinging on the substrate 112.

In particular, the magnetic analyzer 104 may remove unwanted ions from the ion beam 206. The magnetic analyzer 104 acts according to known principles to separate charged species of the ion beam 206 as the ion beam 206 emerges from the ion source 102. The separation is performed according to a ratio of the mass to charge of the particular species in the ion beam 206 so that a charged particles (ions) of a desired mass/charge ratio may be selected to emerge from an exit of the magnetic analyzer 104, which directs the ion beam 206 in a different direction that its original direction. In this manner, the analyzed ion beam 206a is directed toward the ion beam scanning assembly 202.

As detailed below, the ion beam scanning assembly 202 manipulates the analyzed ion beam 206a to produce a processed ion beam 206b whose shape, size, and/or density, among other factors, are altered to improve the characteristics on the ion beam 206. In various embodiments, the ion beam scanning assembly 202 combines the actions of an electrostatic scanner with that of a multipole electrostatic lens that modifies the ion beam spot size, spot shape, and/or ion density of the analyzed ion beam 206a as it traverses the ion beam scanning assembly 202. In particular embodiments detailed with respect to the figures to follow, the ion beam scanning assembly 202 constitutes a quadrupole electrostatic lens that is superimposed on an electrostatic scanner. In other words, the components of the quadrupole electrostatic lens and the electrostatic scanner bound the ion beam 206 along the same portion of the beam path traversed by ion beam 206.

Figure 3A:
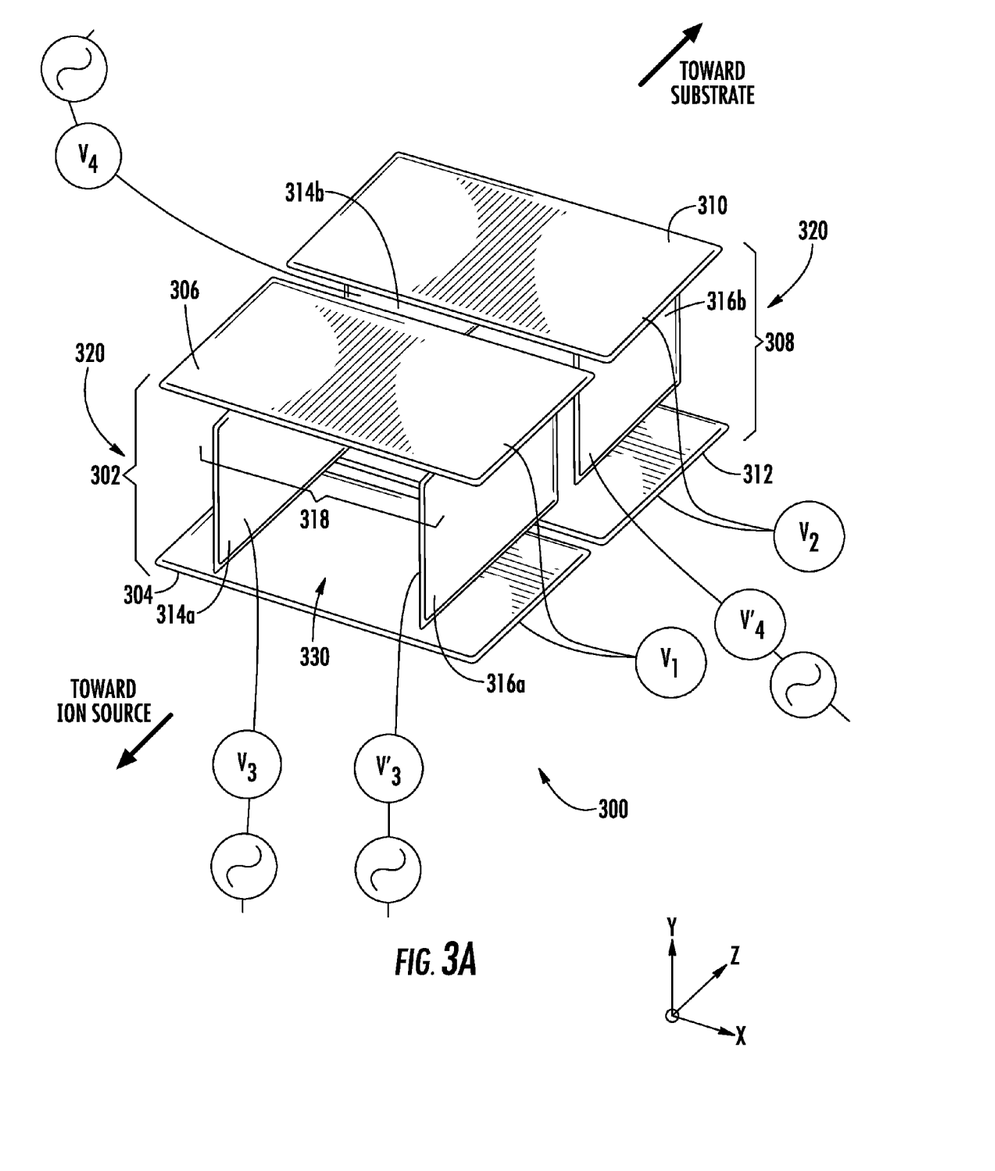
FIG. 3a depicts an embodiment of an ion beam scanning assembly according to an embodiment of the disclosure.

FIG. 3a depicts a perspective view of an embodiment of an ion beam scanning assembly according to an embodiment of the disclosure. In FIG. 3a, the ion beam scanning assembly 300 includes a quadrupole electrostatic lens system 320 that includes a front lens 302 and back lens 308. The front lens 302 includes two pairs of opposed electrodes 304, 306 and 314a, 316a, while the back lens 308 includes another two pairs of opposed electrodes 310, 312 and 314b, 316b. The ion beam scanning assembly 300 also contains an electrostatic scanner component embodied as a set of scanning electrodes 318. In the embodiment depicted in FIG. 3a, the set of scanning electrodes 318 includes two pairs of plates or scanning electrodes 314a, 316a and 314b, 316b. As shown in FIG. 3a, the electrodes 304, 306, 314a, 316a, 310, 312, 341b, 316b of the quadrupole electrostatic lens system 320 and scanning electrodes 314a, 314b, 316a, 316b of the set of scanning electrodes 318 are mutually configured to define a region 330 to transmit an ion beam (not shown) therethrough. When an ion beam passes through region 330 a set of voltages may be applied to the electrodes 304, 306, 310, 312 and 314a, 314b, 316a, 316b to shape and scan the ion beam. These voltages may be adjusted to optimize the beam shape and the magnitude of the beam deflection based on beam energy and ion species.

Figure 3B:
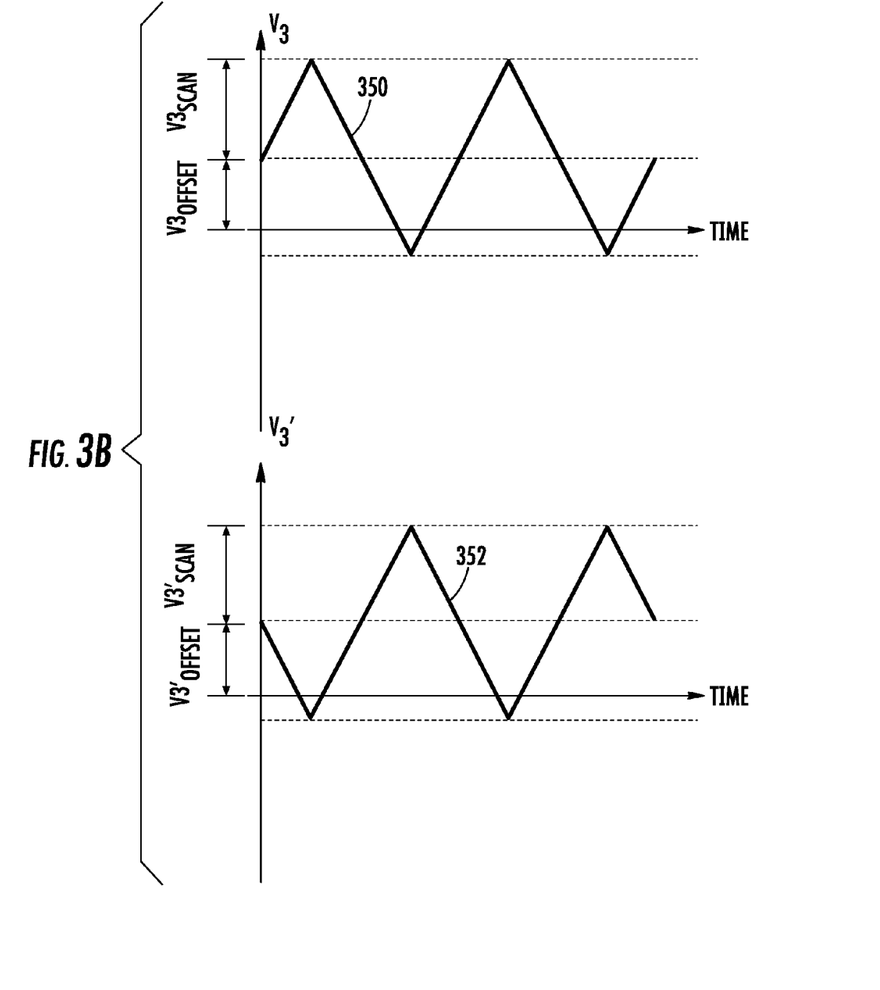
FIG. 3b depicts exemplary waveforms of a set of oscillating voltages applied to an ion beam scanning assembly according to an embodiment of the disclosure.

As additionally shown FIG. 3a, the scanning electrodes 314a, 314b, 316a, 316b of the set of scanning electrodes 318 are connected to respective voltage sources $V_3$, $V_3'$, $V_4$ and $V_4'$, which are applied as AC signals. As further illustrated in FIGS. 3b, and 3c each of the AC voltages $V_3$, $V_3'$, $V_4$ and $V_4'$ constitutes a respective voltage waveform 350, 352, 354, 356 that is composed of an oscillating voltage component, or simply oscillating voltage Vscan and a DC offset voltage Voffset. The oscillating voltages $V_3$scan, $V_3'$scan, $V_4$scan, $V_4'$scan fluctuate with the respect to their DC offset voltages $V_3$offset, $V_3'$offset, $V_4$offset and $V_4'$offset respectively. For example, the AC voltages $V_3$, $V_3'$, $V_4$, $V_4'$ applied to the scanning electrodes 314a, 314b, 316a, 316b may be adjusted in such way that the DC offset voltages $V_3$offset, $V_3'$offset applied to the scanning electrodes 314a, 316a have same magnitude and polarity and the DC offset voltages $V_4$offset, $V_4'$offset applied to the scanning electrodes 314b, 316b have same magnitude and polarity. Moreover, the oscillating voltages $V_3$scan, $V_3'$scan applied to the scanning electrodes 314a, 316a may have same amplitude but opposite phase angle, and the oscillating voltages $V_4$scan, $V_4'$scan applied to the scanning electrodes 314b, 316b may have same amplitude but opposite phase angle. In addition, the oscillating voltages $V_3$scan, $V_4$scan applied to the scanning electrodes 314a, 316a may have same phase angle and the oscillating voltages $V_3'$scan, $V_4'$scan applied to the scanning electrodes 314b, 316b have same phase angle. In this manner, an oscillating electric field is created along the X-direction where the direction and magnitude of the electric field varies with time. Because the X-direction is perpendicular to the direction of propagation of an ion beam traversing the region 330, the ion beam will experience a time dependent deflection force that deflects the ion beam in an alternating fashion towards the scanning electrodes 314a, 314b on the one hand and the scanning electrodes 316a, 316b on the other hand. The oscillating voltages $V_3$scan, $V_3'$scan, $V_4$scan, $V_4'$scan applied to the scanning electrodes 314a, 314b, 316a, 316b may be adjusted in the range of +/−200V to +/−25 kV to optimize the magnitude of the beam deflection based on beam energy. In some embodiments, the ion beam may be deflected through an angle of about +/−10 degrees, while in other embodiments the ion beam may be deflected through an angle of up to about +/−20 degrees. Referring also to FIG. 2, this deflection may cause the ion beam to scan across the width W of a substrate 112.

As further illustrated in FIG. 3a, each electrode 304, 306, 310, 312 is coupled to a respective voltage source (DC voltage generator) $V_1$ or $V_2$ to receive a potential (DC voltage). The DC voltage $V_1$ applied to the electrodes 304 and 306 may be adjusted in such way that $V_1$ has same magnitude but opposite polarity as V3offset and V3'offset, the DC offset voltages applied to the scanning electrodes 314a, 316a. The DC voltage $V_2$ applied to the electrodes 310 and 312 may be adjusted in such way that $V_2$ has same magnitude but opposite polarity as $V_4$offset and $V_4'$offset, the DC offset voltages applied to the scanning electrodes 314b, 316b. A first set of DC voltages $V_1$ applied to the electrodes 304, 306, and V3offset, $V_3'$offset applied to the scanning electrodes 314a, 316a create a static electric field (not shown) that may form a first quadrupole electrostatic lens within the region 330. A second set of DC voltages $V_2$ applied to the electrodes 310, 312, and $V_4$offset, $V_4'$offset applied to the scanning electrodes 314b, 316b create another static electric field (not shown) that may form a second quadrupole electrostatic lens within the region 330. In particular, in the arrangement of FIG. 3a, the direction of propagation of an ion beam (not shown) is along the Z-axis. Accordingly, the quadrupole electrostatic lens system 320 including the first and the second quadrupole electrostatic lenses is formed to generate a set of electrical fields that are perpendicular to the direction of propagation of an ion beam to shape the ion beam as it traverses the region 330. The first set of DC voltages $V_1$ applied to the electrodes 304, 306, and $V_3$offset, $V_3'$offset applied to the scanning electrodes 314a, 316a and the second set of DC voltages $V_2$ applied to the electrodes 310, 312, and $V_4$offset, $V_4'$offset applied to the scanning electrodes 314b, 316b may be adjusted coordinately in the range of −20 kV to +20 kV to optimize the beam shape based on beam energy and ion species.

In addition to scanning an ion beam the ion beam scanning assembly 300 shapes an ion beam by action of the electric fields provided by the quadrupole electrostatic lens system 320. Accordingly, as the ion beam emerges from the ion beam scanning assembly 300 the ion beam may have a different shape, size and ion density as compared to the shape, size, and/or ion density of the ion beam before entry into the ion beam scanning assembly 300.

Figure 3C:
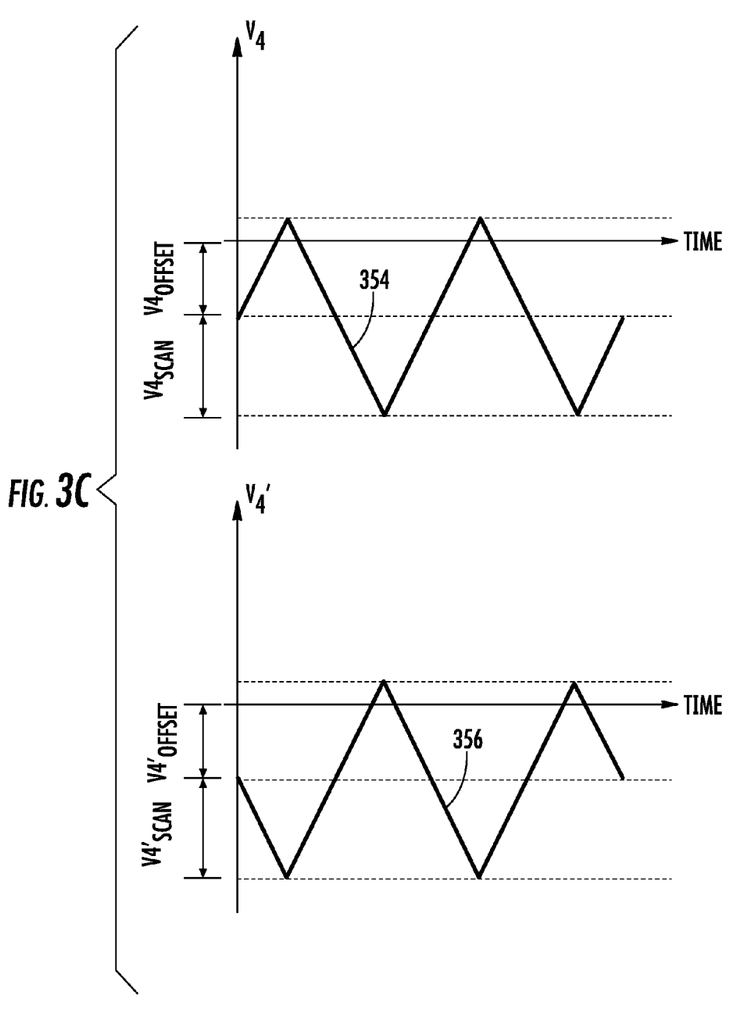
FIG. 3c depicts further exemplary waveforms of a set of oscillating voltages applied to an ion beam scanning assembly according to an embodiment of the disclosure.
Figure 3D:
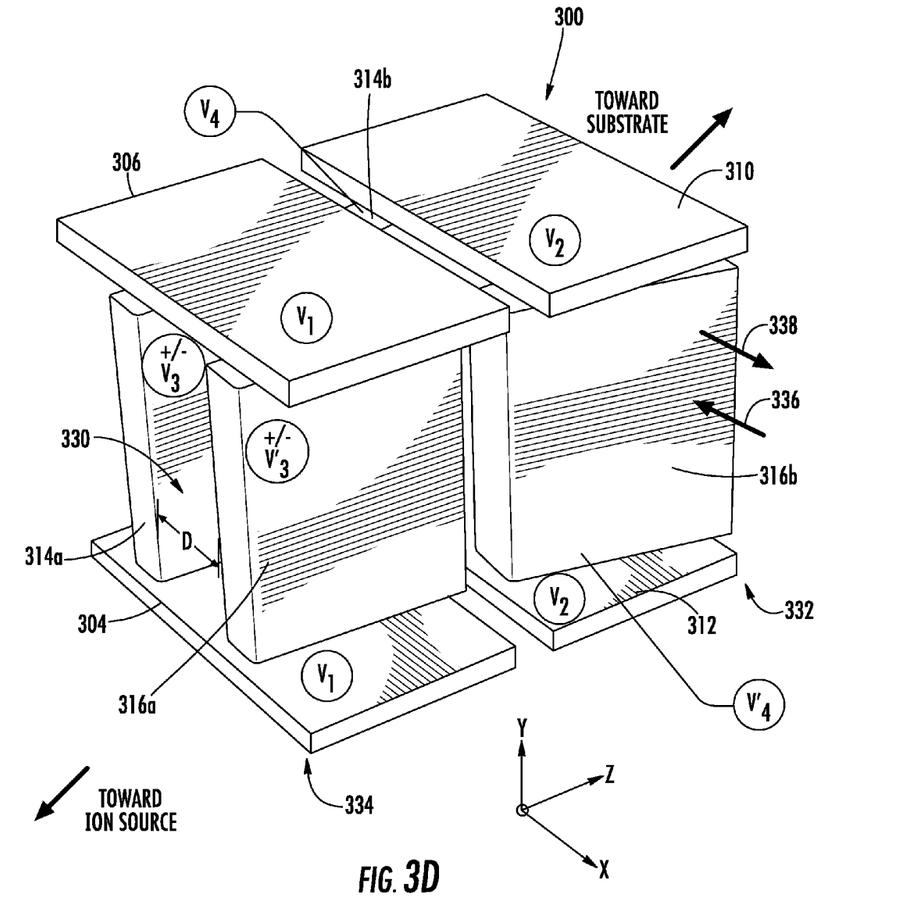
FIG. 3d depicts another embodiment of an ion beam scanning assembly according to an embodiment of the disclosure.

FIG. 3d depicts a variant of the ion beam scanning assembly 300 of FIG. 3a. As illustrated in FIG. 3c, the scanning electrodes 314b, 316b of the set of scanning electrodes 318 have a flared shape as viewed along the Y-axis, such that the separation D between the scanning electrodes 314b, 316b is larger toward the substrate side 332 of the set of scanning electrodes 318 compared to the separation D on the ion source side 334. As noted above, the voltage source $V_3$ may generate an AC signal that causes the polarity of voltage applied between the scanning electrodes 314a, 316a on the one hand and 316a, 316b on the other hand to switch so that a beam of ions (not shown) traversing the region 330 experiences a deflecting field whose direction alternates between the directions 336 and 338. This alternating deflecting field may cause a beam of ions to fan out so as to trace a range of angles, such as +/−10 degrees or more with respect to direction of propagation of the ion beam.

Although FIG. 3c depicts the ion beam scanning assembly 300 as constituting two sets of electrodes 304, 306, 314a, 316a and 310, 312, 315b, 316b in some variants, the ion beam scanning assembly 300 may contain a single set of electrodes or more than two sets of electrodes as in known electrostatic scanners and quadrupole electrostatic lenses. In various embodiments, the electric fields generated by the set of scanning electrodes 318 and the quadrupole electrostatic lens system 320 may be such that the cross-section of an ion beam traversing the region 330 is altered so that the shape of the cross-section of the ion beam at the ion source side 334 differs from that at the substrate side 332.

Figure 4A:
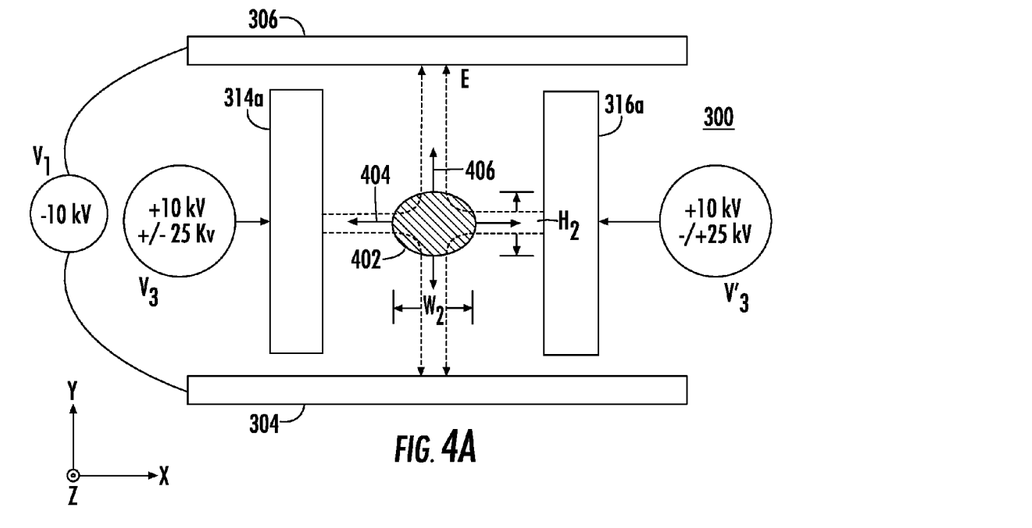
FIG. 4a depicts a front view of an ion beam scanning assembly in one scenario of processing an ion beam consistent with the present embodiments.
Figure 4B:
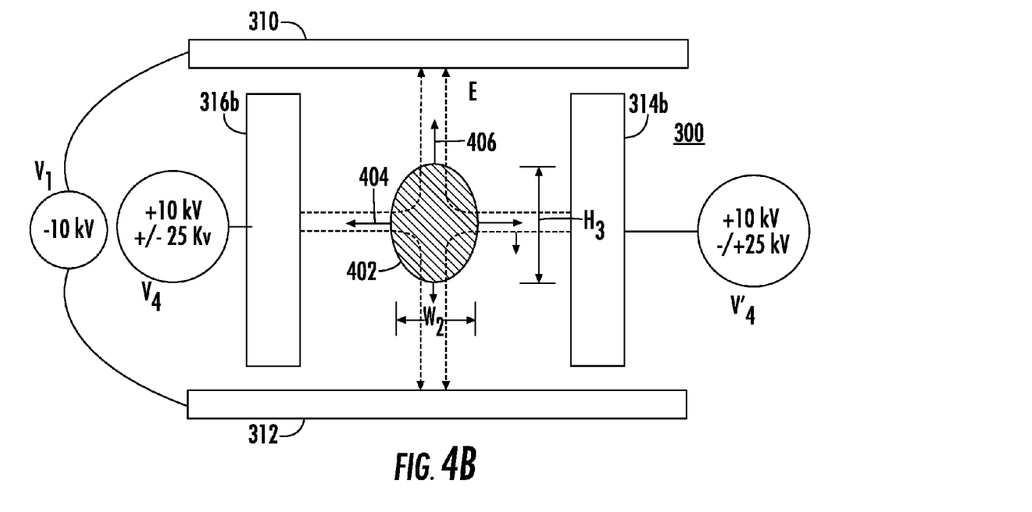
Figure 4C:
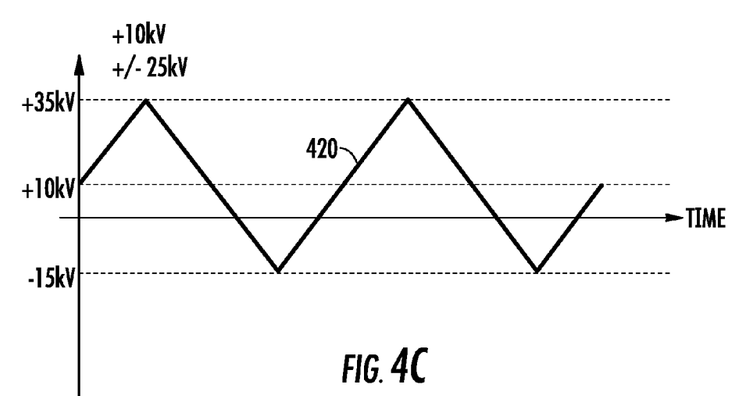
FIGS. 4c and 4d depict exemplary waveforms corresponding to elements of the ion beam scanning assembly depicted in FIGS. 4a and 4b respectively.
Figure 4D:
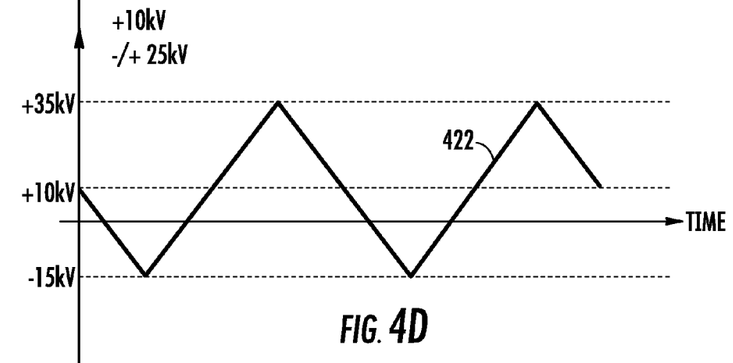

FIG. 4a and FIG. 4b together depict one scenario for processing (treating) an ion beam consistent with the present embodiments. FIG. 4b depicts a back view of the ion beam scanning assembly 300 for the same scenario as illustrated in FIG. 4a. FIGS. 4c and 4d depict exemplary waveforms 420, 422, respectively, which correspond to elements of the ion beam scanning assembly depicted in FIGS. 4a and 4b respectively. In particular, the waveforms 420, 422 are each composed of an oscillating voltage Vscan and a DC offset voltage Voffset as described above with respect to FIGS. 3b and 3c. In FIG. 4a, a front view of the ion beam scanning assembly 300 is illustrated looking downstream in a direction of travel of the ion beam. An ion beam 402 is shown in cross-section as it enters the ion beam scanning assembly 300 at the ion source side 334. As shown in FIG. 4a, the ion beam 402 is a spot beam characterized by a height $H_2$ and width $W_2$. As the ion beam 402 enters the ion beam scanning assembly 300, the ion beam 402 experiences electric fields (E) that are generated by the various electrodes 304, 306, 310, 312, 314a, 314b, 316a, 316b. The scanning electrodes 314a, 314b, 316a, 316b are coupled to AC voltages that generate an oscillating electric field along the direction 404 parallel to the X-axis of the Cartesian coordinate system shown. The oscillating electric field produced by the scanning electrodes 314a, 314b, 316a, 316b causes the position of the beam to vary with time as the ion beam 402 traverses the ion beam scanning assembly 300, although FIG. 4a illustrates only a single position of the ion beam 402.

In some embodiments, the ion beam scanning assembly 300 is used to process an ion beam to be delivered to a substrate with ion energy of 2 keV to 900 keV. In some cases, the absolute value of voltage applied to the scanning electrodes 314a, 314b, 316a, 316b is in the range of 200 V to 35 kV. The embodiments are not limited in this context. In the example illustrated in FIG. 4a, fluctuating voltages applied to the scanning electrodes 314a, 314b on the one hand and 316a, 316b on the other hand is superimposed on a DC offset voltage of +10 kV. The absolute value of the peak voltage applied to the scanning electrodes 314a, 314b, 316a, 316b is 25 kV with respect to the offset voltage of +10 kV, which may deflect the ion beam 402 through a range of angles of about +/−10 degrees in some cases. As illustrated in FIGS. 4c and 4d, it should be noted that in FIGS. 4a and 4b, the +/−25 kV refers an oscillating voltage that fluctuates 25 kV with respect to the offset voltage of +10 kV, and that −/+25 kV refers a oscillating voltage having opposite phase angle with respect to the +/−25 kV.

FIG. 4a further illustrates an example in which a static DC voltage of −10 kV is applied to the electrodes 304, 306 that are coupled with the scanning electrodes 314a, 316a to form the front lens 302 of quadrupole electrostatic lens system 320. Coupled with the DC offset voltage of +10 kV on scanning electrodes 314a, 316a, the application of a negative voltage to the electrodes 304, 306 establishes a set of electric fields that exert a force on the ion beam 402 that tends to expand the ion beam 402 along the direction 406 that is perpendicular to the direction 404. In this manner, the shape of the ion beam 402 in cross-section is altered as the ion beam 402 traverses the ion beam scanning assembly 300.

FIG. 4b depicts a back view of the ion beam scanning assembly 300 facing upstream opposite the direction of travel of the ion beam 402 for the same scenario as illustrated in FIG. 4a. In the example illustrated, a static voltage of −10 kV is applied to the electrodes 310, 312 that are coupled with the scanning electrodes 314b, 316b to form the back lens 308 of quadrupole electrostatic lens system 320. Coupled with the DC offset voltage of +10 kV on scanning electrodes 314b, 316b, this application of negative voltage to the electrodes 310, 312 establishes another set of electric fields that further exerts a force on the ion beam 402 that tends to stretch the ion beam 402 along the direction 406 that is perpendicular to the direction 404. In this manner, as shown in FIG. 4b, as the ion beam 402 emerges from the ion beam scanning assembly 300, the ion beam 402 is elongated along the direction 406 in comparison to its shape when entering the ion beam scanning assembly 300 shown in FIG. 4a. Thus, the ion beam 402 emerges with a height $H_3$ that is greater than $H_2$ of the (incident) ion beam 402.

Figure 4E:
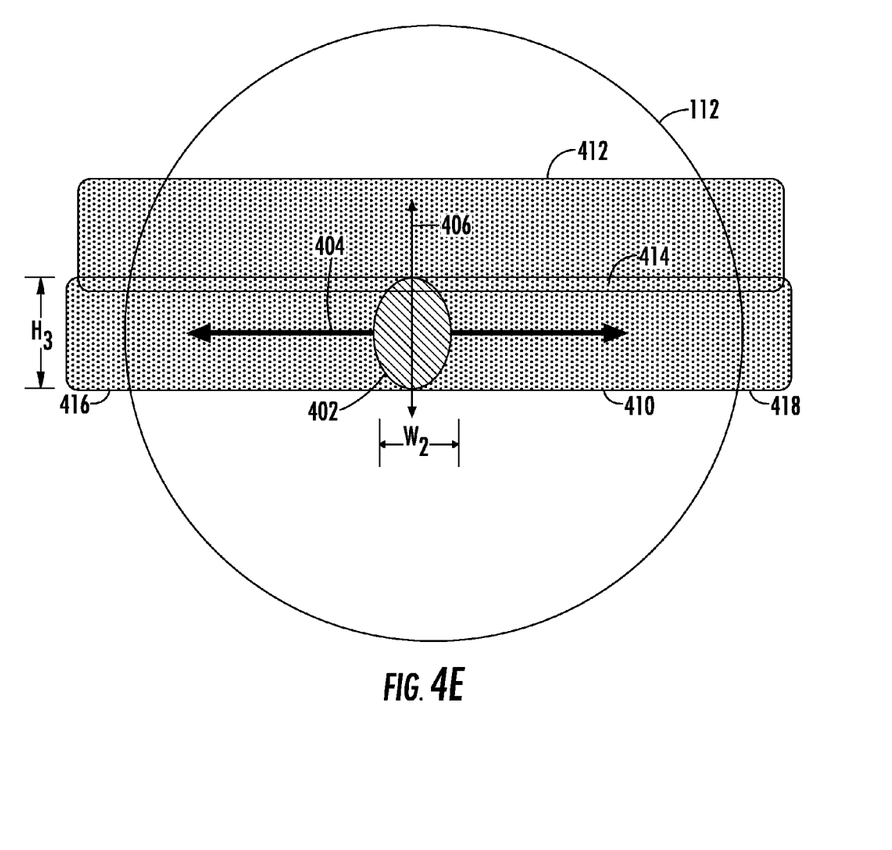
FIG. 4e depicts one example of processing a substrate using the embodiment of FIGS. 4a, 4b.

One advantage provided by the embodiment of FIGS. 4a, 4b is that the increased height $H_3$ of the ion beam 402 provides more uniform ion dose as successive areas of a substrate are exposed to the ion beam 402. However, it is to be noted that the voltages applied to the ion beam scanning assembly 300 may be set so that the height $H_3$ is kept below a dimension where portions of the ion beam 402 strike downstream components of an ion implantation system such as pole pieces of an angle corrector. FIG. 4e depicts one example of processing a substrate 112 using the embodiment of FIGS. 4a, 4b. There are shown two ion exposure areas 410, 412 that are formed when the ion beam 402 is electrostatically scanned using the scanning electrodes 314a, 314b, 316a, 316b while the substrate is positioned at two different positions along the direction 406. Thus, the substrate 112 may be stepped between two different positions to create the two ion exposure areas 410, 412. As illustrated in FIG. 4c, an overlap region 414 exists between the ion exposure areas 410, 412. Because the ion beam 402 has an increased height $H_3$ the control of the overlap region 414 (or an underlap region) may be better as compared to the case where the beam height is only $H_2$ as is the case in the absence of the quadrupole electrostatic lens system 320. This leads to the ability to provide a more uniform ion dose across an entire substrate 112. Moreover, because the quadrupole electrostatic lens system 320 is arranged along the same portion of the beam path of the ion beam 402 as that occupied by the set of scanning electrodes 318, the ion beam scanning assembly and thereby without requiring a larger footprint for an ion implantation system to house the ion beam scanning assembly 300.

Figure 5A:
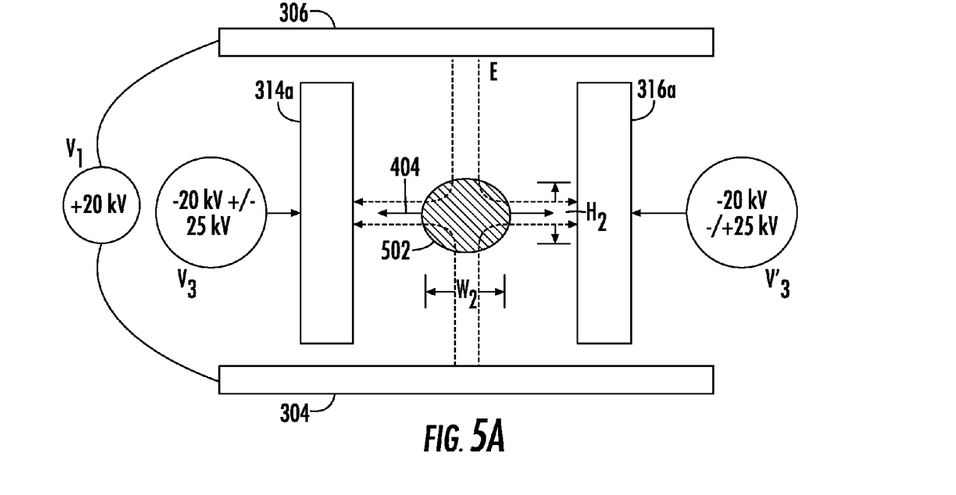
FIG. 5a depicts a front view of an ion beam scanning assembly in one scenario of processing an ion beam consistent with the present embodiments.
Figure 5B:
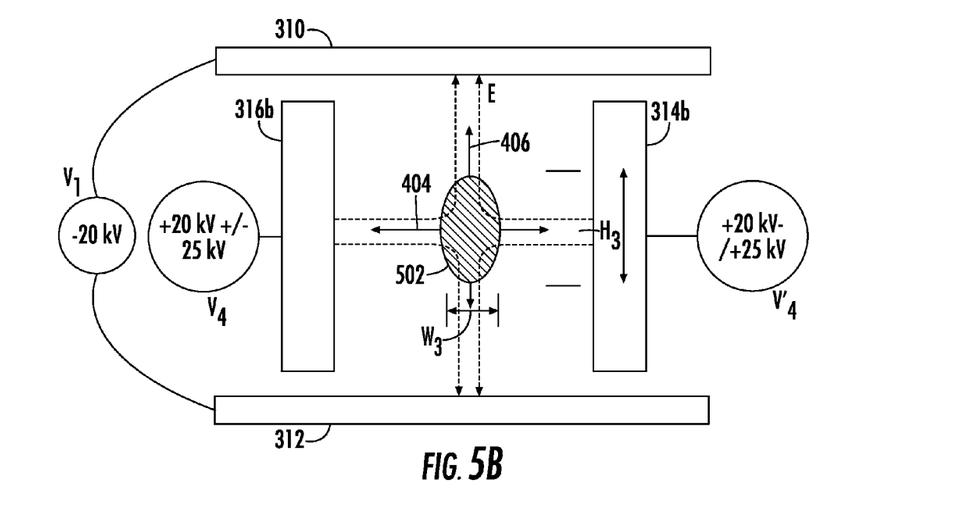
Figure 5C:
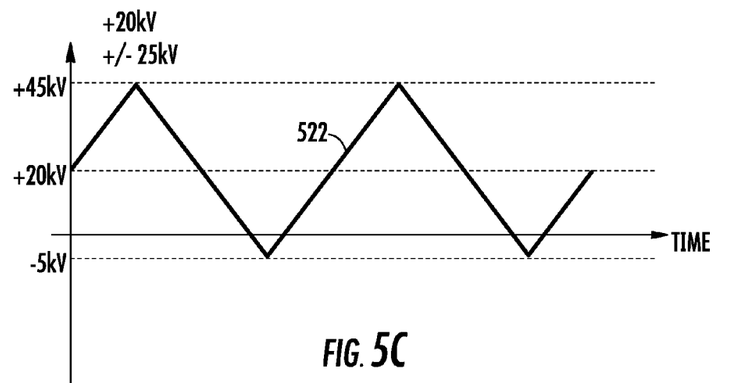
FIGS. 5c and 5d depict exemplary waveforms corresponding to elements of the ion beam scanning assembly depicted in FIGS. 5a and 5b respectively.
Figure 5D:
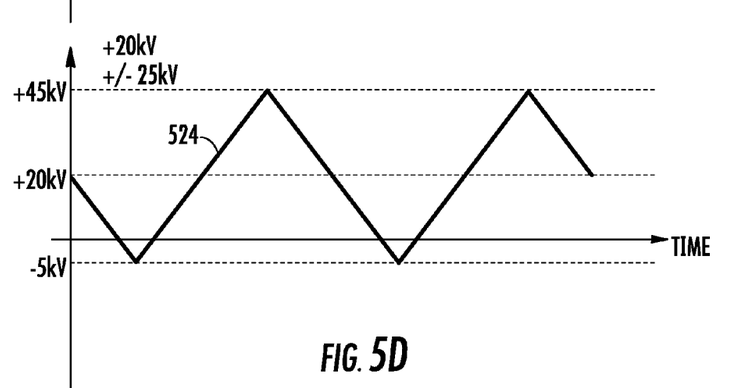

In addition to improving the uniformity of ion dose at a substrate, in additional embodiments the ion beam scanning assembly 300 may be used to increase beam current utilization for ion implantation process(es). The term "beam current utilization" as used herein refers to the fraction of ion beam current, that is the fraction of ions of an ion beam, that are delivered to a substrate. FIG. 5a and FIG. 5b together depict a further scenario for processing (treating) an ion beam consistent with the present embodiments. In FIG. 5a, a front view of the ion beam scanning assembly 300 is illustrated, while in FIG. 5b a back view of the ion beam scanning assembly 300 is shown. FIGS. 5c and 5d depict exemplary waveforms 522, 524, respectively, which correspond to elements of the ion beam scanning assembly depicted in FIGS. 5a and 5b respectively. In particular, the waveforms 522, 524 are each composed of an oscillating voltage Vscan and a DC offset voltage Voffset as described above with respect to FIGS. 3b and 3c.

In the scenario of FIG. 5a, the ion beam 502 is a spot beam, which is shown as having the same dimensions height $H_2$ and width $W_2$ as the ion beam 402 before entering the ion beam scanning assembly 300. Similarly to the scenario of FIG. 4a, in the example illustrated in FIG. 5a, fluctuating voltages applied to the scanning electrodes 314a, 316a is superimposed on a DC offset voltage of −20 kV. The absolute value of the peak voltage applied to the scanning electrodes 314a, 316a is 25 kV with respect to the offset voltage of −20 kV, which may deflect the ion beam 402 through a range of angles of about +/−10 degrees in some cases. As shown in FIG. 5c, it should be noted that in FIG. 5a, the +/−25 kV refers an oscillating voltage that fluctuates 25 kV with respect to the offset voltage of −20 kV, and that −/+25 kV refers an oscillating voltage having opposite phase angle with respect to the +/−25 kV.

However, unlike the case of FIGS. 4a, 4b in the scenario of FIGS. 5a, 5b a different voltage is applied to the front lens 302 as compared to the voltage applied to the back lens 308. In particular, in FIG. 5a, a static voltage of +20 kV is applied to the electrodes 304, 306 that are coupled with the scanning electrodes 314a, 316a to form the front lens 302 of quadrupole electrostatic lens system 320. Coupled with the DC offset voltage of −20 kV on scanning electrodes 314a, 316a, the application of a positive voltage to the electrodes 304, 306 establishes a set of electric fields that exert a force on the ion beam 502 that tends to compress the ion beam 502 along the direction 404. In this manner, the shape of the ion beam 502 in cross-section is further altered as the ion beam 502 traverses the ion beam scanning assembly 300.

FIG. 5b depicts a back view of the ion beam scanning assembly 300 for the same scenario as illustrated in FIG. 5a. In the example illustrated, fluctuating voltages applied to the scanning electrodes 314b, 316b is superimposed on a DC offset voltage of +20 kV, and static voltage of −20 kV is applied to the electrodes 310, 312 that are coupled with the scanning electrodes 314b, 316b to form the back lens 308 similarly to the situation in FIG. 4b. Coupled with the DC offset voltage of +20 kV on scanning electrodes 314a, 316a, this application of negative voltage to the electrodes 310, 312 exerts a force on the ion beam 402 that tends to stretch the ion beam 502 along the direction 406 that is perpendicular to the direction 404. In this manner, as shown in FIG. 5b, as the ion beam 502 emerges from the ion beam scanning assembly 300, the ion beam 502 is elongated along the direction 406 and compressed in the direction 404 in comparison to its shape when entering the ion beam scanning assembly 300 shown in FIG. 5a. Thus, the ion beam 502 emerges with a height $H_3$ that is greater than $H_2$ of the (incident) ion beam 502, and width $W_3$ that is less than the width $W_2$ of the (incident) ion beam 502. In addition, the absolute value of the peak voltages applied to the scanning electrodes 314b and 316b is 25 kV with respect to the offset voltage of +20 kV, which may deflect the ion beam 402 through a range of angles of about +/−10 degrees in some cases. It should be noted that in FIG. 5b, the +/−25 kV refers an oscillating voltage that fluctuates 25 kV with respect to its offset voltage of +20 kV, and that −/+25 kV refers an oscillating voltage having opposite phase angle with respect to the +/−25 kV.

Figure 5E:
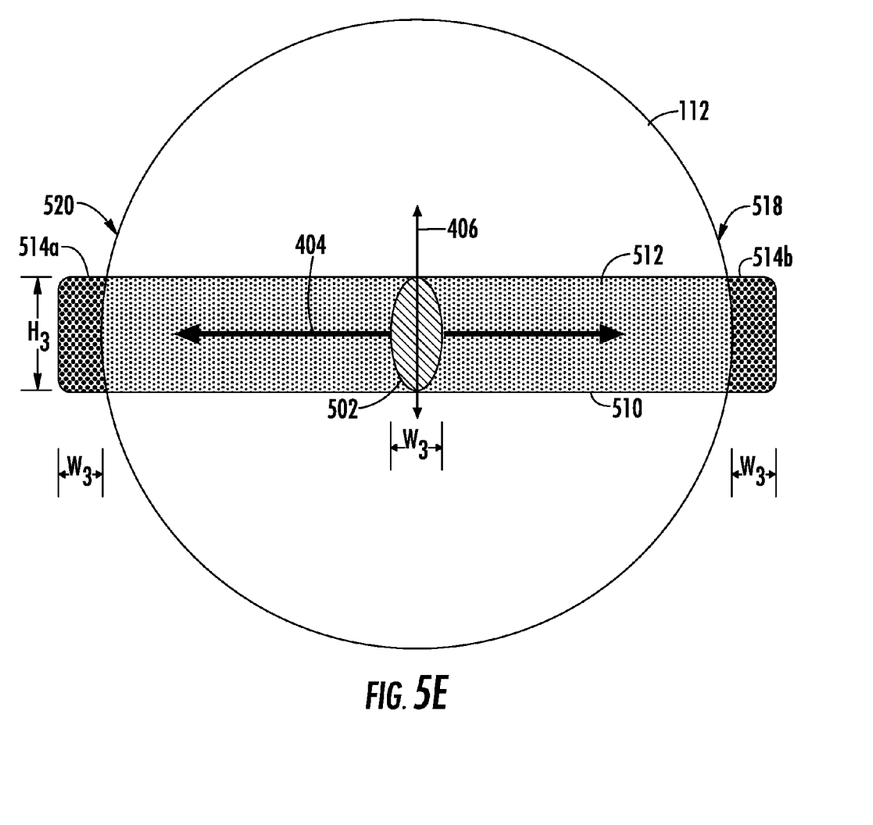
FIG. 5e depicts one example of processing a substrate using the embodiment of FIGS. 5a, 5b.

FIG. 5e depicts one example of processing the substrate 112 using the embodiment of FIGS. 5a, 5b, which illustrates an advantage provided by the embodiment of FIGS. 5a, 5b, namely increased beam current utilization. In particular, the ion beam 502 having the cross-sectional shape characterized by the height $H_3$ and the width $W_3$ of FIG. 5b is shown as it impinges on the substrate 112. The ion beam 502 may be electrostatically scanned using the scanning electrodes 314, 316 to form the exposed area 510. As shown in FIG. 5e, the exposed area 510 includes an exposed substrate area 512, which represents the portion of the exposed area 510 that intercepts the substrate 112. The exposed area 510 further includes off-substrate areas 514a, 514b which represent portions of the exposed area 510 in which ions do not impact the substrate 112. The ratio of the exposed substrate area 512 to the exposed area 510 may be considered as a measure of the beam current utilization. Because the ion beam 502 has a narrower width $W_3$ as compared to the width of the ion beam 502 $W_2$ without the action of the quadrupole electrostatic lens system 320 depicted in FIGS. 5a, 5b, the ion beam 502 may not need to be scanned as far beyond the edges 518, 520 of the substrate 112 to ensure complete exposure of the substrate 112, in comparison to the situation in which the ion beam width is $W_2$ (see, e.g., FIG. 4c in which the off-substrate areas 416, 418 are larger). Accordingly, the beam current utilization is enhanced in the scenario of FIGS. 5a, 5b.

In addition to the aforementioned advantages afforded by the present embodiments, the co-location of a scanner lens component and a quadrupole lens components affords a compact system for manipulating an ion beam that reduces the length of a region along the ion beam path in which electrons are stripped in comparison to configurations in which the components are not collocated. In other words, because the scanner and quadrupole components may attract electrons and thereby strip a passing ion beam of electrons, their collocation into a compact system reduces the length of the ion beam that may be stripped of electrons if the scanner component and quadrupole lens component were located in series fashion along a beam line.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion beam scanning assembly comprising:
   a set of scanning electrodes defining a region therebetween to transmit an ion beam and scan the ion beam in a first plane, the set of scanning electrodes oriented perpendicularly to the first plane; and
   a multipole electrostatic lens system comprising a plurality of electrodes oriented parallel to the first plane, wherein the multipole electrostatic lens system is superimposed on the set of scanning electrodes, wherein the multipole electrostatic lens system and the set of scanning electrodes bound the ion beam along a same portion of a beam path traversed by the ion beam, the multipole electrostatic lens system configured to shape the ion beam in a direction perpendicular to the first plane within the region.

2. The apparatus of claim 1, wherein the multipole electrostatic lens system is a quadrupole electrostatic lens system configured to shape alter the size and the density of the ion beam, the quadrupole electrostatic lens system comprising:
   a first lens comprising a first pair of opposed electrodes and a second pair of opposed electrodes configured to bound opposite sides of the ion beam path over a first segment of the portion of the ion beam path;
   a second lens downstream of the first lens along the ion beam path, the second lens comprising a third pair of opposed electrodes and a fourth pair of opposed electrodes configured to bound opposite sides of the ion beam path; and a set of voltage generators configured to apply a plurality of respective voltages to the first through fourth pair of opposed electrodes, wherein the plurality of voltages generate a set of electric fields perpendicular to the ion beam path.

3. The apparatus of claim 2, wherein the plurality of voltages comprises DC positive voltages within a range of 0 to 50 kV.

4. The apparatus of claim 3, wherein the plurality of voltages comprises DC positive voltages within a range of positive voltage greater than 0 volts up to 50 kV.

5. The apparatus of claim 2, wherein the plurality of voltages comprises DC negative voltages within a range of 0 to −50 kV.

6. The apparatus of claim 5, wherein the plurality of voltages comprises DC negative voltages within a range of negative voltage less than 0 volts up to −50 kV.

7. The apparatus of claim 2, wherein the plurality of voltages comprises oscillating voltages having amplitudes within a range of −25 kV to +25 kV and frequencies within a range of 100 to 2000 Hz.

8. The apparatus of claim 2, wherein the plurality of voltages are configured to expand the ion beam in the direction perpendicular to the first plane.

9. The apparatus of claim 2, wherein the plurality of voltages are configured to compress the ion beam in a direction of the first plane, and stretch the ion beam in a direction perpendicular to the first plane.

10. The apparatus of claim 1, wherein one or more pairs of electrodes of the set of scanning electrodes are operative to generate a respective one or more voltage waveforms that each comprises an oscillating voltage superimposed on a DC offset voltage, wherein an amplitude of the oscillating voltage with respect to the DC offset voltage is within a range of −25 kV to +25 kV, wherein the frequency of the oscillating voltage is within a range of 100 to 2000 Hz, and wherein the DC offset voltage is within a range of −25 kV to +25 kV.

11. The apparatus of claim 1, wherein one or more pairs of electrodes of the set of scanning electrodes are configured to apply respective one or more oscillating electric fields to scan the ion beam.

12. The apparatus of claim 1, wherein one or more pair of electrodes of the set of scanning electrodes are configured to generate respective one or more voltage waveforms that each comprises an oscillating voltage that is superimposed on a DC offset voltage, the oscillating voltage being configured to produce the oscillating field and the DC offset voltage being configured to alter the shape, size and the density of the ion beam.

13. The apparatus of claim 1, wherein one or more pair of electrodes of the set of scanning electrodes comprises a length along the beam path of about 50 to 300 mm.

14. The apparatus of claim 1, wherein one or more pair of electrodes of the set of scanning electrodes have a height in a direction perpendicular to the ion beam path of about 50 mm to 150 mm.

15. A method of treating an ion beam, comprising:

using a set of scanning electrodes defining a region therebetween to transmit an ion beam and scan the ion beam in a first plane, wherein the set of scanning electrodes are oriented perpendicularly to the first plane;

generating one or more oscillating electric fields along the first plane perpendicular to the ion beam within the region;

applying a first set of non-zero voltages to a first lens of a multipole electrostatic lens system, the first lens comprising a first pair of opposed electrodes and a second pair of opposed electrodes configured to bound opposite sides of the beam over the region; and applying a second set of voltages to a second lens of the multipole electrostatic lens system, the second lens comprising a third pair of opposed electrodes and a fourth pair of opposed electrodes configured to bound opposite sides of the beam path over a second segment of the portion of the beam path further from an ion source to generate the ion beam, wherein the first lens and second lens of the multipole electrostatic lens system comprise a plurality of electrodes oriented parallel to the first plane and configured to shape the ion beam within the region, wherein the multipole electrostatic lens system is superimposed on the set of scanning electrodes, wherein the multipole electrostatic lens system and the set of scanning electrodes bound the ion beam along a same portion of a beam path traversed by the ion beam.

16. The method of claim 15, further comprising providing the first and second voltages as DC positive voltages within a range of voltages greater than zero volts up to 50 kV.

17. The method of claim 15, further comprising providing the first and second voltages as DC negative voltages within a range of voltages less than zero volts to −150 kV.

18. The method of claim 15, further comprising providing a respective oscillating voltage to the one or more pair of electrodes of the electrostatic scanner component having an amplitude within a range of −25 kV to +25 kV and frequency within a range of 100 to 2000 Hz.

19. The method of claim 15, the generating the one or more oscillating electric fields further comprising providing respective one or more oscillating voltages as an oscillating voltage waveform comprising an oscillating voltage component that is superimposed on a DC offset voltage, wherein an amplitude of the oscillating voltage component with respect to the DC offset voltage is within a range of −25 kV to +25 kV, wherein a frequency of the oscillating voltage component is within a range of 100 to 2000 Hz, and wherein the DC offset voltage is within a range of −25 kV to +25 kV.

* * * * *